United States Patent [19]

Tompsett

[11] 4,192,015

[45] Mar. 4, 1980

[54] OPTICAL IMAGE SENSOR SEMICONDUCTOR APPARATUS

[75] Inventor: Michael F. Tompsett, New Providence, N.J.

[73] Assignee: Bell Telephone Laboratories, Incorporated, Murray Hill, N.J.

[21] Appl. No.: 883,476

[22] Filed: Mar. 6, 1978

[51] Int. Cl.² .................... G11C 11/42; G11C 13/04
[52] U.S. Cl. ................................ 365/114; 315/169.2
[58] Field of Search ............. 315/169 TV; 178/7.3 D; 365/183, 114

[56] References Cited

U.S. PATENT DOCUMENTS

| | | | |
|---|---|---|---|
| 3,944,816 | 3/1976 | Harada | 250/211 J |
| 3,967,052 | 6/1976 | Judice | 178/6 |
| 3,996,599 | 12/1976 | King | 357/30 |
| 3,997,719 | 12/1976 | Judice | 178/7.3 |

Primary Examiner—Terrell W. Fears
Attorney, Agent, or Firm—David I. Caplan

[57] ABSTRACT

The optical intensity pattern of a two-dimensional image field is electrically scanned a line at a time by a shift register access technique, thus providing a first stream of bits for each line. Each of these bits in a given line is compared with a dither coded second stream of bits generated in response to the background illumination (absence of image) along a line immediately adjacent to the line being scanned. The resulting sequence of comparisons is a dither coded signal representation of the line being scanned, which is compensated for nonuniform background illumination of the image field.

10 Claims, 5 Drawing Figures

FIG. 4

OPTICAL IMAGE SENSOR SEMICONDUCTOR APPARATUS

FIELD OF THE INVENTION

This invention relates to optical imaging and transmission systems, and more particularly to semiconductor apparatus for providing an electrical signal with gray scale information representative of an optical image.

BACKGROUND OF THE INVENTION

In many optical image transmission systems, it is desired that the transmitted image information have a gray scale characteristic, that is, that the transmitted information concerning a given localized area be characterized by multi-level information capability rather than merely a binary (bright vs. dark) level characteristic. One system for transmitting such multi-level or gray scale information involves the technique of "dither" coding. In this technique, a plurality of typically sixteen (16) different possible optical intensity threshold levels are pre-assigned in a given spatial pattern, and the brightness of each image point is compared with a pre-selected one of these sixteen levels. The outcome of each comparison is represented by a binary digital signal, "1" or "0". Thus, if a given first localized area is brighter than a given second localized area, more of the image points within the first area will have greater brightness ("positive" response) than the pre-assigned dither threshold levels, and thus there will be more image points within the first area than in the second area which result in "positive" responses with respect to the dither coded pattern. Accordingly, the average optical intensity of a given area corresponds to the number of "positive" responses, each such response represented by the binary digital "1", as opposed to "negative" responses (lesser brightness than dither threshold levels), each such negative response represented by the binary digital "0". Upon transmission and display of the corresponding two-dimensional pattern of all these 1's and 0's by means of bi-level display cells, the human eye observer obtains the desired gray scale impression of local relative intensity, in accordance with the relative number of cells that are "positive" vs. "negative".

Various two-dimensional spatial patterns for the pre-assigned dither coding levels can be pre-assigned, in order to minimize various systematic or other errors resulting from the point sampling inherent in the dither technique. Moreover, as disclosed in U.S. Pat. No. 3,953,668, issued to C. N. Judice on Apr. 27, 1976, the flicker which results in dither image displays in an interlaced optical field format can be eliminated by localized intensity averaging of a cluster of cells. However, regardless of the selected dither coding pattern or "matrix", there remains another source of error, namely, nonuniform background illumination.

As shown in FIG. 1, the background illumination I extending from $x_1$ to $x_2$ over an object 11, such as a line of a page of print to be imaged by an optical imaging system, varies with location x. Accordingly, if the imaging system is to be characterized by a dither coded gray scale capability, a serious error is introduced if the intensity of each image point is compared with a predetermined fixed dither coded level of illumination, that is, if the dither level is not corrected for nonuniform background illumination.

SUMMARY OF THE INVENTION

In order to correct for errors in dither coding caused by nonuniform background illumination, the optical radiation from a given line of an illuminated object to be imaged is focused upon a first line array substantially identical photorespective semiconductive storage elements, while simultaneously the optical radiation from a uniformly diffusely-reflecting reference surface along a line in the immediate neighborhood of the given line of the object is focused upon a second line array of photoresponsive semiconductive storage elements, each element having a selected one of m-different response characteristics corresponding to the m different levels in the desired dither code. Using shift register controlled access techniques, various storage elements in the first and second lines are accessed and the respective stored charges in these elements are compared with one another in a predetermined sequence, thereby yielding a time sequence of 1's and 0's representative of the desired dither coding of the given line of the illuminated object, corrected for nonuniform background illumination.

In a specific embodiment of the invention, a semiconductor dither coding apparatus is provided by a first line array of N substantially identical photoresponsive semiconductive charge storage elements parallel to a second line array of N similar charge storage elements but having differing photoresponse characteristics in accordance with a dither code. Specifically, the elements in each spatial period of m elements in the second line have m mutually different responses corresponding to the dither code, where m is at least 4 and is typically 16. Shift register access means are provided for sequentially addressing each element of the first line simultaneously with each element of the second line; the stored charge in each element in the first line is then directly compared with the stored charge of a predetermined element in the second line by a flip-flop or other comparator charge detector, to provide an output signal of "1" vs. "0" representative of the dither coded intensity of each element in the first line.

In another specific embodiment of the invention, a semiconductor dither coding apparatus is provided by first and second line arrays of storage elements as in the previously described embodiment; but, instead of the previously described shift register for sequential addressing of the elements for direct comparison by a flip-flop detector, all the stored charges in the first and second lines are simultaneously introduced into first and second semiconductor charge coupled devices, respectively, which thereafter sequentially deliver the respective stored charges to a flip-flop or other comparator charge detector in accordance with a predetermined sequence.

BRIEF DESCRIPTION OF THE DRAWINGS

This invention together with its objects, features, and advantages, may be better understood from the following detailed description when read in conjunction with the drawings in which:

FIG. 4 is a timing diagram useful for explaining the operation of the apparatus illustrated in FIG. 3.

Only for the sake of clarity, none of the drawings is to any scale.

DETAILED DESCRIPTION

Figure 1:
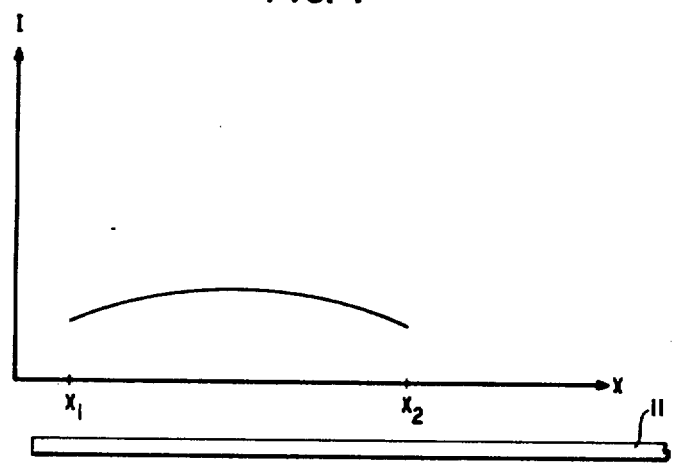
FIG. 1 is a plot of background illumination vs. distance along a line of an optical image.
Figure 2:
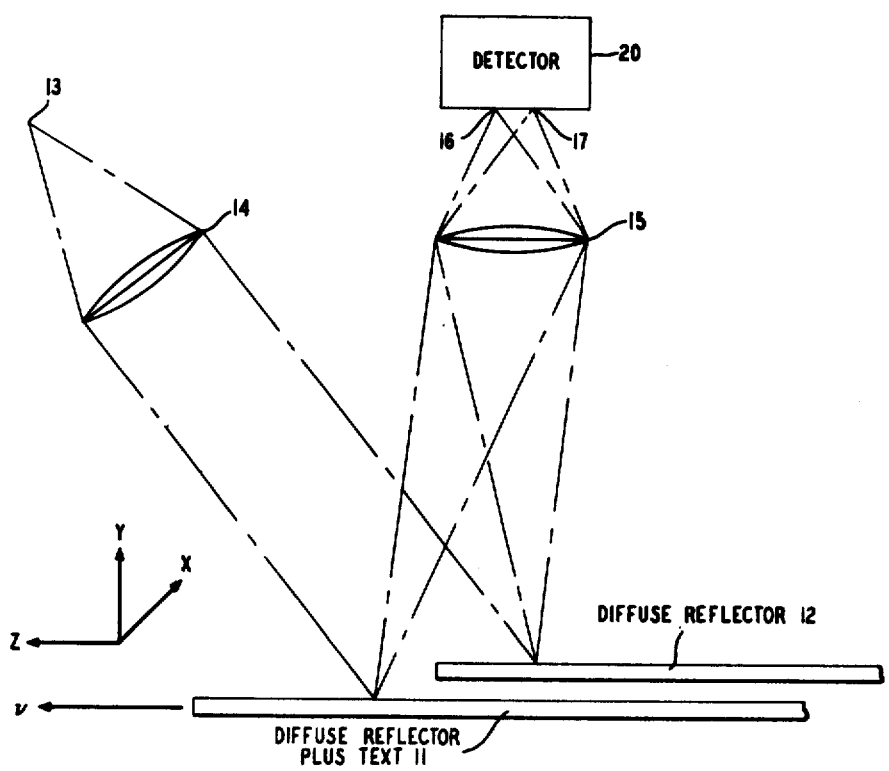
FIG. 2 is a diagram of apparatus for optical imaging in accordance with an embodiment of the invention.

As shown in FIG. 2, the object 11 is illuminated by a light source 13 whose radiation is directed on a uniformly diffuse reflector 12 and on the object by a lens 14. The object 11, typically a page of printed text, is translated with velocity v thereby exposing a sequence of different lines to the radiation. The resulting reflected light is focused by another lens 15 onto a semiconductor dither coding apparatus 20, thereby forming images 16 and 17 corresponding to the uniformly diffuse reflector 12 and the object 11.

Only a line (perpendicular to the plane of FIG. 2) of each of such images at a time is of interest and is detected by the semiconductor dither coding detector apparatus 20. One form of this apparatus 20 is illustrated in FIG. 3 and another in FIG. 5.

Figure 3:
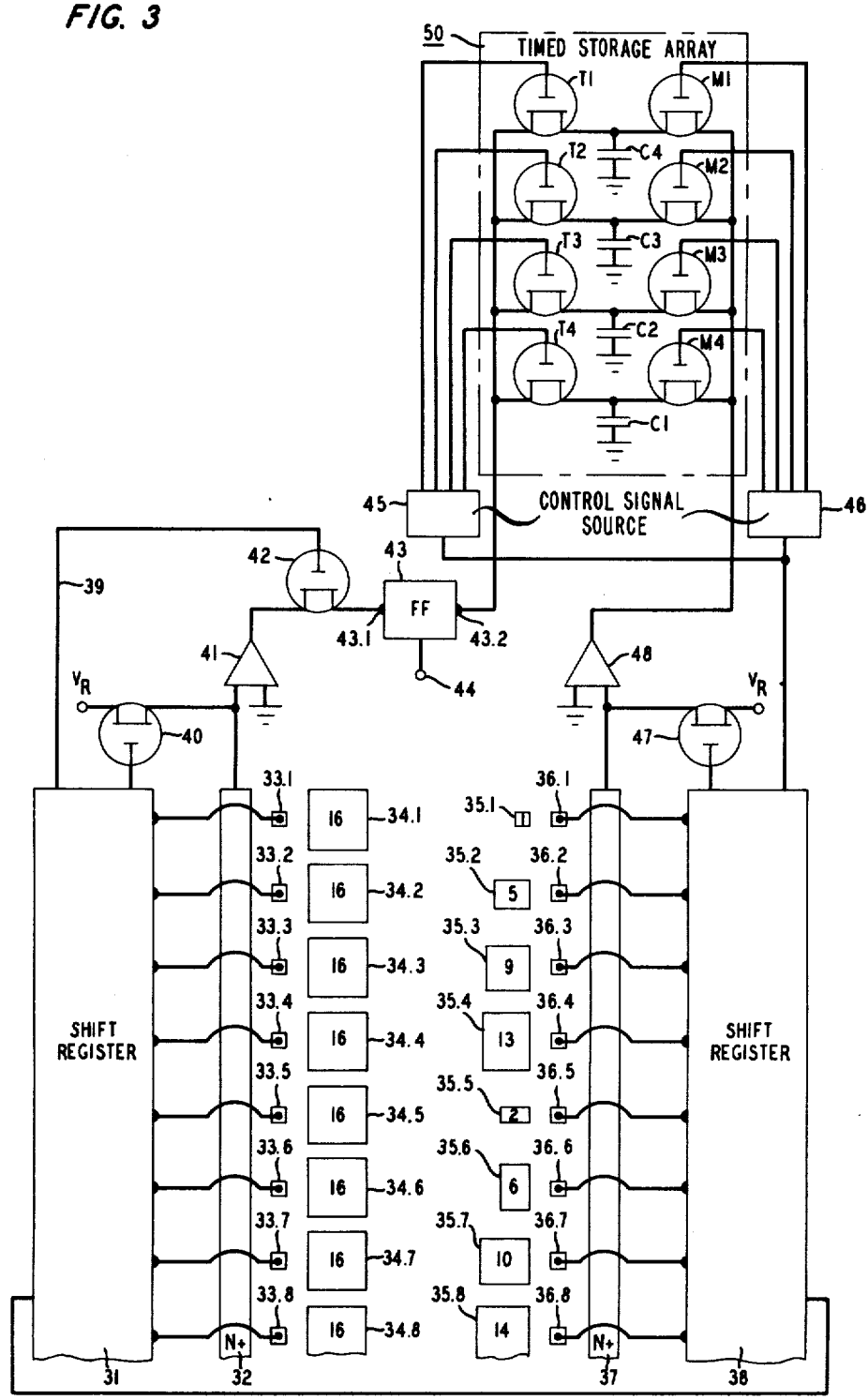
FIG. 3 is a diagram of semiconductor apparatus for dither coding of an optical image in accordance with a specific embodiment of the invention.

As shown in FIG. 3, all cells in a first column line of photosensitive semiconductor charge storage cells 34.1–34.8 are substantially identical in size, that is have equal apertures, each aperture and cell being equivalent to say 16 units of optical radiation receiving sensitivity by reason of substantially identical construction. The apertures can be defined by the area of the impurity diffusion used for forming the storage cells. Cells in a second column line of rectangular apertured photosensitive semiconductor charge storage cells 35.1–35.8 are characterized by various sensitivities ranging in integer values from 1 to 16 by reason of various apertures whose areas are indicated by the various encircled numbers in each rectangular aperture. The column line of substantially identical storage cells 34.1, etc., is positioned, by means of appropriate optical steps (not shown), in registry with the image 17 (FIG. 2) of the line of text of the object 11; while the column line of dither coded storage cells 35.1, etc., is positioned in registry with the image 16 of the line of the uniformly diffuse reflector 12. Typically there are nm = N substantially identical cells in the first line 34.1, etc., where N is thus a multiple m of n = 16 in the typical case of n = 16 dither levels; whereas there are an equal number N cells in the second line 35.1, etc., with the dither coded apertures, that is a predetermined sequence of different areas of impurity diffusions which define the cells. Each of the first line charge storage cells is accessible for charge readout into an N+ diffusion stripe 32 by a separate gate electrode of the first line array of gate electrodes 33.1, etc.; whereas each of the second line storage cells is accessible for charge readout into an N+ diffusion stripe 37 by a separate gate electrode of the second line array 36.1, etc. As is obvious in the integrated semiconductor circuit technology, the storage cells can take the form of localized N+ diffusions at the major surface of the same monocrystalline silicon semiconductor body (not indicated in the drawing) as the N+ readout detector stripes 32 and 37; whereas the gate electrodes for controlling readout access addressing can take the form of metal or metal-like plates proximate to, but insulated from, the major surface of the semiconductor body, as known in the insulated gate field effect transistor (IGFET) or metal-oxide-semiconductor (MOS) technology. These gate electrodes are individually controlled by shift registers 31 and 38 which also control the gates of an FET 40 and an FET 47 for periodically discharging readout detector stripes 32 and 37, respectively, to a reference voltage source $V_R$. The N+ diffusion stripe 32 is connected, via a preamplifier 41, through the high current path of an FET 42 to an input terminal 43.1 of a flip-flop detector 43 with output terminal 44; whereas the N+ diffusion stripe 37 is connected, via a preamplifier 48, through a timed storage array 50 to another input terminal 43.2 of the flip-flop detector. The timed storage array 50 contains FETs $M_1$, $M_2$, $M_3$, and $M_4$, $T_1$, $T_2$, $T_3$, and $T_4$ which are controlled in accordance with timed "ON" pulses from control signal sources 45 and 46, whose output control signals are described in greater detail below. As known in the semiconductor MOS integrated circuit technology, the flip-flop detector, the preamplifier, the shift register, the N+ diffusions, the FETs, and the charge storage cells can all be integrated in a single silicon semiconductor body.

During operation, the storage cells 34.1, etc., and 35.1, etc., (FIG. 3) receive light from the reflectors 11 and 12 (FIG. 2) and develop stored charge in accordance with the light intensity on each respective cell, dither coded in the case of the cells 35.1, etc. After a suitable charge integration time interval, the shift register 31 successively energizes each of the first line gate electrodes 33.1, etc. for readout of the stored charge in each of the first line of cells, while the shift register 32 successively energizes each of the second line gate electrodes 36.1, etc. for readout of the dither coded stored charge in each of the second line of cells.

Figure 4:
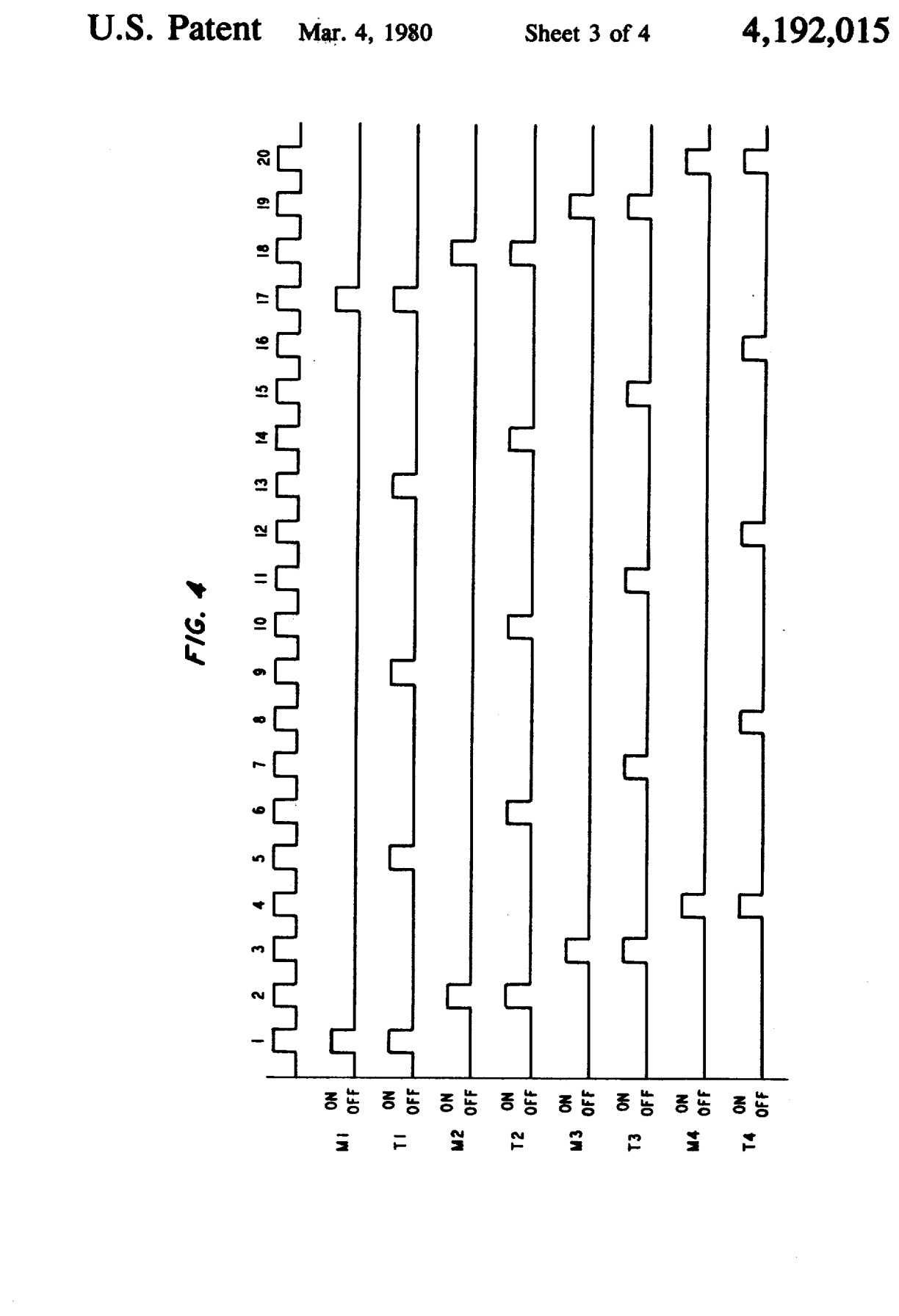

With reference to the timing curve 51 in FIG. 4, during the first time slot the shift register 31 energizes gate electrode 33.1 in order to transfer the photogenerated charges in the cell 34.1 into the N+ diffusion stripe 32, while the shift register 38 energizes the gate electrode 36.1 in order to transfer the photogenerated charges in the cell 35.1 into the N+ diffusion stripe 37. Then, during the time interval between the first and second time slots, FETs 40 and 47 are turned "ON" in order to bring the potentials of the N+ diffusion stripes back to $V_R$, for resetting these stripes prior to the next transfer. During the second time slot, the charges in cells 34.2 and 35.2 are transferred into the N+ diffusion stripes 32 and 37, respectively, by virtue of energizing the gate electrodes 33.2 and 36.2, respectively, by the shift registers 31 and 38, respectively. And so on for the rest of the cells. Meanwhile, FET 42 is turned "ON" during each of these time slots in order to apply a signal to the input terminal 43.1 of the flip-flop detector 43 corresponding to the potential of, and hence charge in, the N+ diffusion stripe 32 as amplified by a preamplifier 41; while the FETs $M_1$, $M_2$, $M_3$, $M_4$, $T_1$, $T_2$, $T_3$, and $T_4$ are turned "ON" during time slots as indicated in FIG. 4. The capacitors $C_1$, $C_2$, $C_3$, and $C_4$ thus store, for time intervals of 16 slots, the various outputs of the diffusion stripe 37, as amplified by a preamplifier 48. In this way, only the outputs of the first four cells 35.1–35.4 are delivered to the input terminal 43.2 of the flip-flop detector 43, while the outputs of the first sixteen cells 33.1–33.16 are delivered to the input terminal 43.1 of the flip-flop. Thereby, the outputs of these cells are compared by the flip-flop as follows:

| 33.1 | 35.1 | (1) |
|------|------|-----|
| 33.2 | 35.2 | (5) |

-continued

| | | |
|---|---|---|
| 33.3 | 35.3 | (9) |
| 33.4 | 35.4 | (13) |
| 33.5 | 35.1 | (1) |
| 33.6 | 35.2 | (5) |
| 33.7 | 35.3 | (9) |
| 33.8 | 35.4 | (13) |
| 33.9 | 35.1 | (1) |
| 33.10 | 35.2 | (5) |
| 33.11 | 35.3 | (9) |
| 33.12 | 35.4 | (13) |
| 33.13 | 35.1 | (1) |
| 33.14 | 35.2 | (5) |
| 33.15 | 35.3 | (9) |
| 33.16 | 35.4 | (13) | the numbers in parentheses indicating the dither weight of the various cells 35.1, etc.

Thereby, the sequence of binary digital outputs at terminal 44 represents a dither coding of the line of text of the object 11 (FIG. 2) then focused on the line of cells 35.1, etc., corrected for nonuniformity in background illumination. After translating the object 11 by a distance equal to the predetermined line-width resolution, the next (second) line of text is similarly read out except that $M_1$, $M_2$, $M_3$, and $M_4$ are now turned "ON" during time slots 5, 6, 7, and 8, respectively (instead of 1, 2, 3, and 4), so that the dither code weights are now 2, 6, 10 and 14 (instead of 1, 5, 9, 13). Similarly the next (third) line of text is read out except that $M_1$, $M_2$, $M_3$, and $M_4$ are turned "ON" during time slots 9, 10, 11 and 12; and then the fourth line of text is read out with $M_1$, $M_2$ $M_3$, and $M_4$ turned "ON" during time slots 13, 14, 15, and 16. The fifth line of text is read out with the same sequence for $M_1$, $M_2$, $M_3$, and $M_4$ as the first line; the sixth line is read out just as the second line; and so on. Thereby, the desired dither coded representation of an entire page of text is obtained. It should be understood, from FIG. 4, that the sequences of being "ON" for the $M_1$, $M_2$, $M_3$, and $M_4$ are periodic in 16 time slots, in order to cover an entire line of more than 16 cells.

Figure 5:
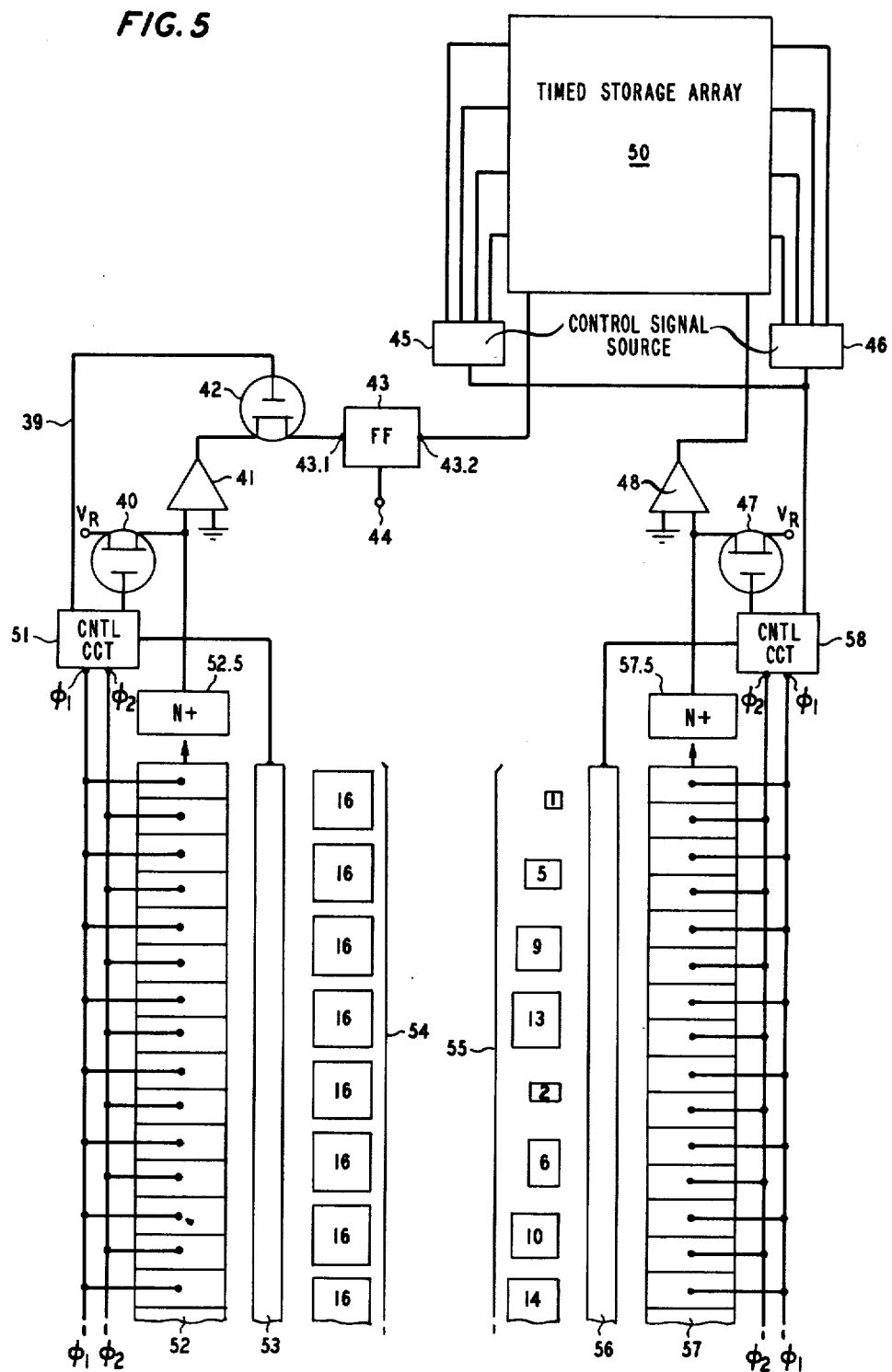
FIG. 5 is a diagram of semiconductor apparatus for dither coding of an optical image in accordance with another specific embodiment of the invention.

As known in the art, a semiconductor charge coupled device can be used in conjunction with a linear image sensor array, by moving the photogenerated charges along a transfer channel to an output diode charge detector. Accordingly, instead of the shift register addressing control in the apparatus of FIG. 3, linear semiconductor charge coupled devices (CCDs) 51 and 56 can be used as indicated in the apparatus shown in FIG. 5. These CCDs are controlled typically by two clock phases $\phi_1$, $\phi_2$ although, as known in the art, one or three or more phase operation is also useful. These clock phases are produced by control circuitry 51 and 58, also as known in the art. Other elements in FIG. 5 are similar to these in FIG. 3 and are given the same reference numerals plus twenty (20), except that single gate electrodes 53 and 56 are used to control transfers of charges from the storage cell arrays 54 and 55, respectively, into the CCDs which, in turn, shift these charges sequentially to their respective output diodes 52.5 and 57.5. Thus, the operation with the CCDs in the apparatus shown in FIG. 5 is quite similar to that of the apparatus shown in FIG. 3.

Although this invention has been described in detail in connection with specific embodiments, various modifications can be made without departing from the scope of the invention.

I claim:

1. Semiconductor apparatus comprising
   (a) a first linear array of a first plurality of substantially identical photosensitive semiconductor charge storage cells;
   (b) a second linear array of a second plurality of photosensitive storage cells, said cells of the second array characterized by first through m'th mutually different photosensitivities, said second array integrated in a single crystal semiconductor body with the first array.

2. Apparatus according to claim 1 in which m is equal to at least 4, and in which the first array is parallel to the second array.

3. Apparatus according to claim 2 which further comprises shift register means for sequentially reading out the stored charges in the first and second arrays to form, respectively, first and second sequences of signals, circuit means for selecting samples from said second sequence of signals and for delivering said samples to a second input terminal of a signal comparator means, said comparator means having a first input terminal for receiving the first sequence of signals in order to form an output in the form of a third sequence of binary digital bits each in accordance with the outcome of said comparator means.

4. Apparatus according to claim 1 which further comprises shift register means for sequentially reading out the stored charges in the first and second arrays to form, respectively, first and second sequences of signals, and a charge sensor comparator means for receiving and comparing said first and second sequences to form a third sequence of binary digital bits each in accordance with the outcome of said comparator means, comparing a signal from the first sequence with a signal from the second sequence.

5. Apparatus according to claim 1 which further comprises means for directing on said first array optical radiation emanating from a first illuminated object and for directing on said second array optical radiation emanating from a second illuminated object.

6. Semiconductor apparatus according to claim 1 which further includes a third linear array of MOS gates, the first plurality in number, each gate of the third array for controlling the flow of charge from a separate one of the storage cells in the first array to a charge sensor comparator, and a fourth array of MOS gates, the second plurality in number, each gate for controlling the flow of charge from a separate one of the storage cells in the second array to said charge comparator.

7. Semiconductor apparatus according to claim 1 in which cells with different sensitivities are formed by regions of correspondingly different areas of impurity diffusion in the semiconductor body.

8. Semiconductor apparatus which comprises
   (a) a first linear array of N substantially identical photoresponsive semiconductor charge storage cells, each cell located in a single crystal semiconductor body at a major surface thereof;
   (b) a second linear array of N photoresponsive semiconductor charge storage cells parallel to the first linear array, each cell of said second array located in said semiconductor body at the major surface thereof, characterized in that the N cells of the second array have dither coded photosensitivities.

9. Semiconductor apparatus according to claim 8 which further comprises first and second linear semiconductor charge coupled devices for receiving periodically the stored charges in the first and second, respectively, linear arrays of charge storage cells.

10. Semiconductor apparatus according to claim 9 which further includes means for receiving first and second outputs of said first and second, respectively, charge coupled devices and for comparing each of the first outputs with a preselected output of a subgroup of the second outputs.

* * * * *